(12) United States Patent
Haas et al.

(10) Patent No.: US 10,580,289 B2
(45) Date of Patent: *Mar. 3, 2020

(54) SENSOR INTEGRATED CIRCUITS AND METHODS FOR SAFETY CRITICAL APPLICATIONS

(71) Applicant: Allegro MicroSystems, LLC, Manchester, NH (US)

(72) Inventors: David J. Haas, Concord, NH (US); Juan Manuel Cesaretti, Ciudad de Buenos Aires (AR); William P. Taylor, Amherst, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/444,347

(22) Filed: Jun. 18, 2019

(65) Prior Publication Data
US 2019/0392702 A1    Dec. 26, 2019

Related U.S. Application Data

(63) Continuation of application No. 15/622,459, filed on Jun. 14, 2017, now Pat. No. 10,380,879.

(51) Int. Cl.
*G01R 35/00* (2006.01)
*G08B 29/14* (2006.01)
(Continued)

(52) U.S. Cl.
CPC .............. *G08B 29/14* (2013.01); *G01D 3/08* (2013.01); *G01R 33/0023* (2013.01);
(Continued)

(58) Field of Classification Search
CPC .... G08B 29/14; G08B 21/182; G08B 29/185; G01R 33/07; G01R 33/09; H04L 25/4902
See application file for complete search history.

(56) References Cited

U.S. PATENT DOCUMENTS

| 5,592,058 A | 1/1997 | Archer et al. |
| 6,373,307 B1 * | 4/2002 | Takai .................. G11C 7/1051 327/141 |

(Continued)

FOREIGN PATENT DOCUMENTS

| CN | 105634361 A | 6/2016 |
| EP | 0 848 489 A2 | 6/1998 |

(Continued)

OTHER PUBLICATIONS

U.S. Appl. No. 16/365,855, filed Mar. 27, 2019, Daubert et al.
(Continued)

*Primary Examiner* — Munear T Akki
(74) *Attorney, Agent, or Firm* — Daly, Crowley, Mofford & Durkee, LLP

(57) ABSTRACT

A sensor integrated circuit includes at least two processing channels responsive to the same or different analog input signals to generate respective processed signals. The two processing channels are non-homogenous and, in some embodiments have different processing accuracies. A checker circuit receives the first and second processed signals and is configured to detect a fault in the sensor integrated circuit when the first and second processed signals differ from each other by more than a predetermined amount.

29 Claims, 8 Drawing Sheets

(51) Int. Cl.

| | |
|---|---|
| *G01D 3/08* | (2006.01) |
| *G01R 33/00* | (2006.01) |
| *G01R 33/07* | (2006.01) |
| *G08B 21/18* | (2006.01) |
| *G08B 29/18* | (2006.01) |
| *H04L 25/49* | (2006.01) |
| *G01R 33/09* | (2006.01) |
| *G01R 31/28* | (2006.01) |

(52) U.S. Cl.
CPC ............ *G01R 33/07* (2013.01); *G01R 33/09* (2013.01); *G08B 21/182* (2013.01); *G08B 29/185* (2013.01); *H04L 25/4902* (2013.01); *G01R 31/2829* (2013.01)

(56) References Cited

U.S. PATENT DOCUMENTS

| | | | |
|---|---|---|---|
| 7,772,838 | B2 | 8/2010 | Bailey et al. |
| 8,280,568 | B2 | 10/2012 | Nakatsu et al. |
| 8,917,043 | B2 | 12/2014 | Reynolds et al. |
| 8,917,044 | B2 | 12/2014 | Reynolds et al. |
| 9,194,884 | B1* | 11/2015 | Mossman ............... G01R 1/00 |
| 9,329,057 | B2 | 5/2016 | Foletto et al. |
| 9,411,023 | B2 | 8/2016 | Friedrich et al. |
| 9,780,706 | B2 | 10/2017 | Allegrini et al. |
| 10,380,879 | B2 | 8/2019 | Haas et al. |
| 2003/0001537 | A1 | 1/2003 | Yang et al. |
| 2003/0070126 | A1* | 4/2003 | Werner ............ G01R 31/31715 |
| | | | 714/715 |
| 2003/0127289 | A1 | 7/2003 | Elgas et al. |
| 2005/0007044 | A1 | 1/2005 | Qiu et al. |
| 2006/0195720 | A1* | 8/2006 | Watts ........................ H03F 1/52 |
| | | | 714/11 |
| 2007/0001629 | A1 | 1/2007 | McGarry et al. |
| 2011/0062909 | A1 | 3/2011 | Patel et al. |
| 2012/0074972 | A1 | 3/2012 | Rasbornig et al. |
| 2012/0211299 | A1 | 8/2012 | Yanai |
| 2013/0106340 | A1 | 5/2013 | Chabaud et al. |
| 2013/0200909 | A1 | 8/2013 | Rasbornig et al. |
| 2013/0249544 | A1* | 9/2013 | Vig .................... G01R 33/0011 |
| | | | 324/252 |
| 2014/0028237 | A1 | 1/2014 | Park et al. |
| 2014/0184200 | A1* | 7/2014 | Milano ................. G01R 33/072 |
| | | | 324/202 |
| 2014/0285124 | A1 | 9/2014 | Derammelaere et al. |
| 2014/0333241 | A1 | 11/2014 | Zhao et al. |
| 2015/0015241 | A1 | 1/2015 | Tamura |
| 2015/0185279 | A1* | 7/2015 | Milano .............. G01R 31/2884 |
| | | | 324/750.3 |
| 2015/0185284 | A1 | 7/2015 | Milano et al. |
| 2015/0185293 | A1 | 7/2015 | Milano et al. |
| 2015/0241523 | A1 | 8/2015 | Scherr |
| 2015/0354985 | A1 | 12/2015 | Judkins, III et al. |
| 2016/0025820 | A1 | 1/2016 | Scheller et al. |
| 2016/0139199 | A1 | 5/2016 | Petrie et al. |
| 2016/0139229 | A1 | 5/2016 | Petrie et al. |
| 2017/0110652 | A1 | 4/2017 | Doogue et al. |
| 2017/0346420 | A1 | 11/2017 | Ross et al. |
| 2018/0367073 | A1 | 12/2018 | Haas |

FOREIGN PATENT DOCUMENTS

| | | |
|---|---|---|
| JP | H 03231317 A | 10/1991 |
| JP | 2005/067667 A | 3/2006 |
| JP | 2010/045914 A | 2/2010 |
| KR | 101394556 B1 | 5/2014 |

OTHER PUBLICATIONS

Emadi, McMaster University "Advanced Electric Drive Vehicles", 2015, 3 pages.
Extended European Search Report dated Jan. 23, 2019 for European Application No. 18192781.5; 8 Pages.
Extended European Search Report dated Oct. 4, 2018 for European Application No. 18176741.9; 7 Pages.
International Standard ISO 26262-1 "Road Vehicles—Functional Safety—Part 1 Vocabulary", Nov. 15, 2011, 30 pages.
International Standard ISO 26262-5 "Road Vehicles—Functional Safety—Part 5 Product development at the hardware level", Nov. 15, 2011, 86 pages.
International Standard ISO 26262-9 "Road Vehicles—Functional Safety—Part 9 Automotive Safety Integrity Level (ASIL)-oriented and safety-oriented analyses", Nov. 15, 2011, 24 pages.
Microchip WebSeminars "Sensorless Field Oriented Control (FOC) for Permanent Magnet Synchronous Motors (PMSM)", 51 pages.
Non-Final Office Action dated Mar. 8, 2019 for U.S. Appl. No. 15/697,846; 19 Pages.
Restriction Requirement dated Apr. 6, 2018 for U.S. Appl. No. 15/622,459, 5 pages.
Response to Restriction Requirement and Preliminary Amendment filed Jun. 1, 2018 for U.S. Appl. No. 15/622,459, 10 pages.
Office Action dated Sep. 17, 2018 for U.S. Appl. No. 15/622,459, 11 pages.
Response to Office Action filed Dec. 10, 2018 for U.S. Appl. No. 15/622,459, 14 pages.
Notice of Allowance dated Mar. 18, 2019 for U.S. Appl. No. 15/622,459; 10 pages.
Response to Office Action filed Jun. 27, 2019 for European Application No. 18176741.9; 68 pages.
Final Office Action dated Jun. 27, 2019, for U.S. Appl. No. 15/697,846; 18 pages.
Response to Final Office Action and Request for Continued Examination filed Sep. 6, 2019, for U.S. Appl. No. 15/697,846; 17 pages.
Response to Office Action filed Sep. 13, 2019 for European Application No. 18192781.5; 18 pages.
U.S. Appl. No. 16/695,698, filed Nov. 26, 2019, Haas et al.

* cited by examiner

SENSOR INTEGRATED CIRCUITS AND METHODS FOR SAFETY CRITICAL APPLICATIONS

CROSS REFERENCE TO RELATED APPLICATIONS

This application is a Continuation application and claims the benefit of U.S. patent application Ser. No. 15/622,459, filed on Jun. 14, 2017, which is incorporated herein by reference.

STATEMENT REGARDING FEDERALLY SPONSORED RESEARCH

Not Applicable.

FIELD

This disclosure relates generally to sensor integrated circuits and, more particularly, to such circuits and associated methods designed to meet strict safety requirements.

BACKGROUND

As is known, sensors are used to perform various functions in a variety of applications. Some sensors include one or magnetic field sensing elements, such as a Hall effect element or a magnetoresistive element, to sense a magnetic field associated with proximity or motion of a target object, such as a ferromagnetic object in the form of a gear or ring magnet, or to sense a current, as examples.

Sensors are often provided in the form of integrated circuits (IC) containing one or more semiconductor die supporting electronic circuitry and optionally also containing additional elements, such as a magnet and/or passive components, such as capacitors, inductors, or resistors.

Sensor integrated circuits are widely used in automobile control systems and other safety critical applications. There are a variety of specifications that set forth requirements related to permissible sensor quality levels, failure rates, and overall functional safety. One approach to meeting such mandates has been to use redundant, identical circuits in a sensor integrated circuit.

SUMMARY

A sensor integrated circuit includes a first processing channel responsive to a first analog signal to generate a first processed signal and a second processing channel responsive to a second analog signal to generate a second processed signal, with the second processing channel being non-homogenous with respect to the first processing channel. A checker circuit responsive to the first processed signal and the second processed signal is configured to detect a fault in the sensor integrated circuit when the first and second processed signals differ from each other by more than a predetermined amount. The non-homogeneity between the first and second processing channels can include one of more of: the first processing channel having a different accuracy than the second processing channel, the first processing channel containing at least one different circuit element than the second processing channel, t the first processing channel generating the first processed signal according to a first sensing methodology and the second processing channel generating the second processed signal according to a second sensing methodology that is different than the first sensing methodology, and the first analog signal being generated by a first type of magnetic field sensing element and the send analog signal being generated by a second type of magnetic field sensing element that is different than the first type of magnetic field sensing element.

Also described is a sensor integrated circuit including a first processing channel responsive to a first analog signal to generate with a first accuracy a first processed signal and a second processing channel responsive to a second analog signal to generate with a second accuracy a second processed signal, wherein the second accuracy is different than the first accuracy. A checker circuit is responsive to the first processed signal and the second processed signal and configured to detect a fault in the sensor integrated circuit when the first processed signal and the second processed signal differ from each other by more than a predetermined amount.

Features may include one or more of the following individually or in combination with other features. The sensor integrated circuit may include at least one first magnetic field sensing element configured to sense a magnetic field and generate the first analog signal for coupling to the first processing channel and at least one second magnetic field sensing element configured to sense the magnetic field and generate the second analog signal for coupling to the second processing channel. The at least one first magnetic field sensing element and the at least one second magnetic field sensing element may be different types of sensing elements, such as a Hall effect element or a magnetoresistance element. The different types of sensing elements may include one or more of a planar Hall effect element, a vertical Hall effect element, a circular vertical Hall effect element, Indium Antimonide (InSb), a giant magnetoresistance (GMR) element, an anisotropic magnetoresistance (AMR) element, a tunneling magnetoresistance (TMR) element or a magnetic tunnel junction (MTJ) element.

The sensor integrated circuit may further include a sensing element configured to sense a parameter and generate both the first analog signal for coupling to the first processing circuit and the second analog signal for coupling to the second processing circuit. In some embodiments, the sensing element is a resistor and the parameter is a current.

The first processing channel may include a first analog-to-digital converter to convert the first analog signal into a first digital signal and the second processing channel may include a second analog-to-digital converter to convert the second analog signal into a second digital signal. The first analog-to-digital converter may have a first conversion accuracy and the second analog-to-digital converter may have a second conversion accuracy different than the first conversion accuracy. For example, the first analog-to-digital converter may take the form of a sigma-delta analog-to-digital converter and the second analog-to-digital converter may take the form of a dual slope analog-to-digital converter.

In some embodiments, the sensor integrated circuit may form an angle sensor. In such an embodiment, the first processing channel may include a zero crossing detector and the second processing channel may include a CORDIC processor. The sensor integrated circuit may include a circular vertical Hall element configured to sense a magnetic field and generate the first analog signal for coupling to the first processing channel and a pair of vertical Hall elements configured to sense the magnetic field and generate the second analog signal for coupling to the second processing channel.

In some embodiments, the sensor integrated circuit may form a current sensor. In such an embodiment, the first processing channel may include a first analog filter having a first accuracy and the second processing channel may include a second analog filter having a second accuracy different that the first accuracy. The first analog filter may be a switched capacitor filter and the second analog filter may be an RC filter.

In some embodiments, the sensor integrated circuit may form a linear magnetic field sensor, a speed sensor, or a motor controller.

The checker circuit generates a fault signal indicative of whether the first processed signal and the second processed signal differ from each other by more than the predetermined amount. The predetermined amount may take the form of a predetermined percentage. In embodiments, the sensor integrated circuit includes a PWM generator responsive to the first processed signal to generate a PWM output signal having a duty cycle related to a level of the first processed signal, a multiplexer having a first input coupled to receive the PWM output signal, a second input coupled to receive a reference signal, an output at which a selected one of the PWM output signal or the reference signal is provided, and a pull-down resistor coupled to the output of the multiplexer, wherein the multiplexer is controlled by the fault signal. The checker circuit may include a first sample circuit configured to sample the first processed signal and generate a first sampled signal, a second sample circuit configured to process the second processed signal and generate a second sampled signal, and a window comparator responsive to the first and second sampled signals and configured to generate the fault signal.

Features of the checker circuit may include one or more of the following individually or in combination with other features. The checker circuit may include a time delay synchronizer providing a clock signal to the first sample circuit and to the second sample circuit and to the window comparator. The checker circuit may include a delay element coupled to an input of the first sample circuit and configured to delay the first processed signal for coupling to the first sample circuit.

The sensor integrated circuit may further include a second checker circuit responsive to the first processed signal and the second processed signal and configured to detect a fault in the sensor integrated circuit when the first processed signal and the second processed signal differ from each other by more than the predetermined amount.

In embodiments, the sensor integrated circuit may contain a single semiconductor die configured to support the first processing channel, the second processing channel, and the checker circuit. Alternatively, the sensor integrated circuit may contain multiple semiconductor die with a first semiconductor die configured to support the first processing channel and a second semiconductor die configured to support the second processing channel and the checker circuit.

In a multiple redundant semiconductor die embodiment, the checker circuit may provide a first checker circuit and the sensor integrated circuit may further include a first semiconductor die configured to support the first processing channel, the second processing channel, and the first checker circuit. This embodiment further includes a third processing channel responsive to a third analog signal to generate with the first accuracy a third processed signal, a fourth processing channel responsive to a fourth analog signal to generate with the second accuracy a fourth processed signal, a second checker circuit responsive to the third processed signal and the fourth processed signal and configured to detect a fault in the sensor integrated circuit when the third processed signal and the fourth processed signal differ from each other by more than the predetermined amount, and a second semiconductor die configured to support the third processing channel, the fourth processing channel, and the second checker circuit.

Also described is a method for providing a fault output signal for a sensor integrated circuit including processing a first analog signal with a first processing channel having a first accuracy to generate a first processed signal, processing a second analog signal with a second processing channel having a second accuracy to generate a second processed signal, wherein the second accuracy is different than the first accuracy, comparing the first processed signal and the second processed signal, and providing an indication of a fault in the sensor integrated circuit based on the comparison.

Features may include one or more of the following individually or in combination with other features. The method may include sensing a magnetic field with at least one first magnetic field sensing element to generate the first analog signal for coupling to the first processing channel and sensing the magnetic field with at least one second magnetic field sensing element to generate the second analog signal for coupling to the second processing channel. The at least one first magnetic field sensing element and the at least one second magnetic field sensing element may be provided as different types of sensing elements. For example, the at least one first magnetic field sensing element may be provided by one or more Hall effect elements and the at least one second magnetic field sensing element may be provided by one or more magnetoresistance elements. As another example, the at least one first magnetic field sensing element may be provided in the form of a first type of magnetoresistance element and the at least one second magnetic field sensing element may be provided in the form of a second type of magnetoresistance element.

In embodiments, processing the first analog signal with the first processing channel may include converting the first analog signal to a first digital signal with a first type of analog-to-digital converter and processing the second analog signal with the second processing channel may include converting the second analog signal to a second digital signal with a second type of analog-to-digital converter, wherein the first type of analog-to-digital converter is different than the second type of analog-to-digital converter.

Also described is a sensor integrated circuit including first means for processing a first analog signal to generate with a first accuracy a first processed signal, second means for processing a second analog signal to generate with a second accuracy a second processed signal, wherein the second accuracy is different than the first accuracy, and comparison means responsive to the first processed signal and the second processed signal for detecting a fault in the sensor integrated circuit when the first processed signal and the second processed signal differ from each other by more than a predetermined amount. The sensor integrated circuit may further include first magnetic field sensing means for sensing a magnetic field to generate the first analog signal and second magnetic field sensing means for sensing the magnetic field to generate the second analog signal, wherein the first magnetic field sensing means and the second magnetic field sensing means include different types of magnetic field sensing elements.

BRIEF DESCRIPTION OF THE DRAWINGS

The foregoing features of the disclosure, as well as the disclosure itself may be more fully understood from the following detailed description of the drawings. The drawings aid in explaining and understanding the disclosed technology. Since it is often impractical or impossible to illustrate and describe every possible embodiment, the provided figures depict one or more exemplary embodiments. Accordingly, the figures are not intended to limit the scope of the invention. Like numbers in the figures denote like elements.

DETAILED DESCRIPTION

Figure 1:
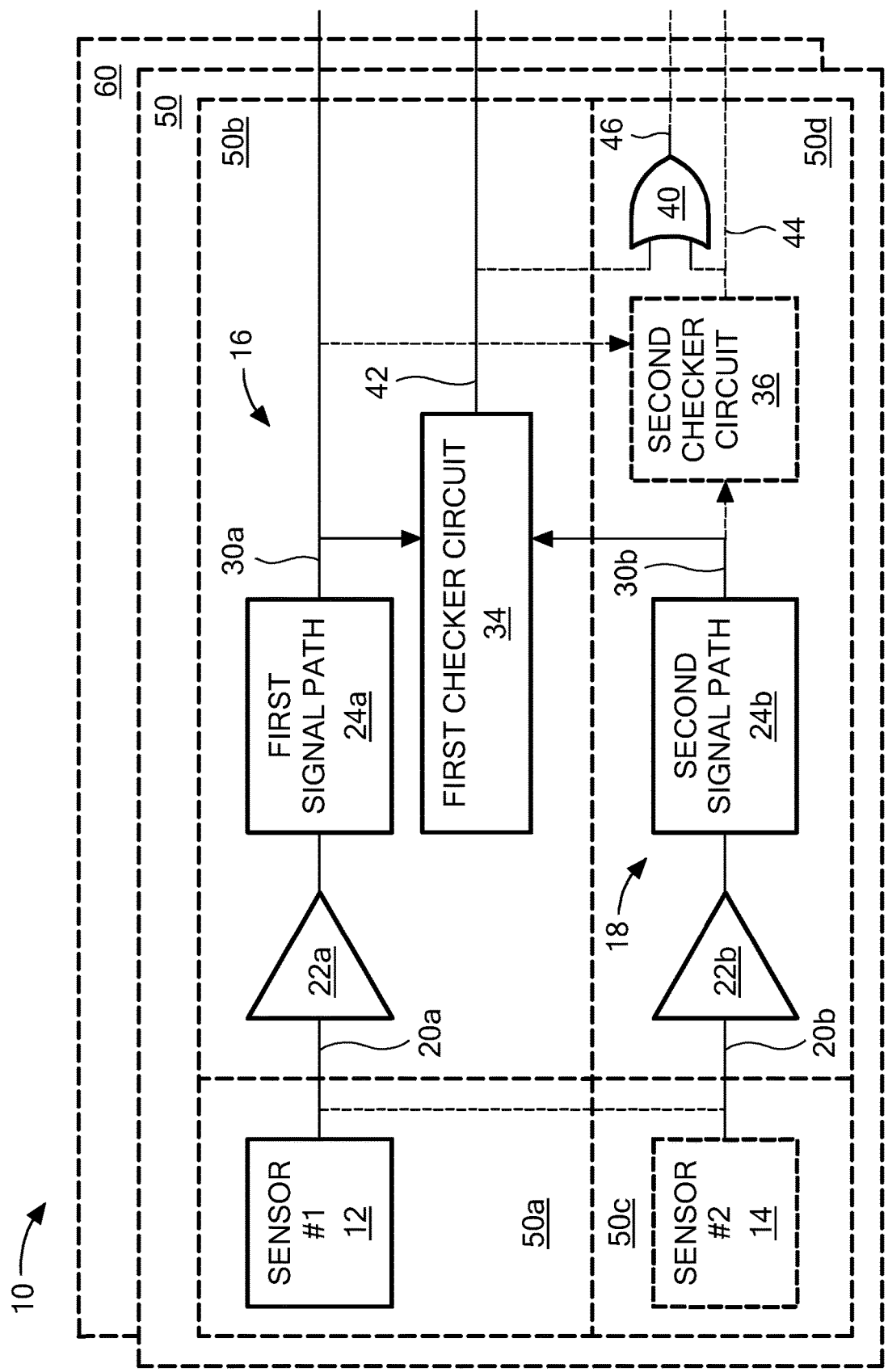
FIG. 1 is a block diagram of a sensor integrated circuit including non-homogenous processing channels.

Referring to FIG. 1, a sensor integrated circuit (IC) 10 includes a first processing channel 16 responsive to a first analog signal 20a to generate with a first accuracy a first processed signal 30a and a second processing channel 18 responsive to a second analog signal 20b to generate with a second accuracy a second processed signal 30b. The second accuracy of the second processing channel 18 is different than the first accuracy of the first processing channel 16. A checker circuit, or error detector 34 is responsive to the first processed signal 30a and the second processed signal 30b and is configured to detect a fault in the sensor IC 10 when the first processed signal 30a and the second processed signal 30b differ from each other by more than a predetermined amount.

The first and second processing channels 16, 18 each are designed to sense an external parameter by processing analog signals 20a, 20b to provide a respective processed signal 30a, 30b indicative of the sensed parameter. In embodiments, the first processing channel 16 may be referred to as a primary processing channel designed to meet a more demanding set of requirements (e.g., a faster processing speed and/or accuracy) and the second processing channel 18 may be referred to as a secondary processing channel designed to meet less demanding requirements, but still sufficient to achieve operational redundancy to meet the applicable safety standards. The processed signals 30a, 30b differing from each other by more than a predetermined amount (as determined by the checker circuit 34) provides an indication that a fault has occurred within the sensor IC 10.

More generally, a high level of safety standard compliance can be achieved by using two unique (i.e., non-homogenous) processing channels 16, 18 and a checker circuit 34 to compare the outputs of the two channels. What is meant by "non-homogenous" processing channels 16, 18 is that the channels differ from each other in at least one way. Examples of non-homogeneities between the processing channels 16, 18 include providing the processing channels with different accuracies, providing the processing channels with one or more different types of circuit elements and/or circuitry, providing different analog input signals to each processing channel, and/or by implementing different sensing methodologies in the processing channels. Furthermore, the processing channels can have more than one non-homogeneity with respect to each other. Specific examples of types of processing channel non-homogeneities will be described below.

Some safety standards specify different fault performance requirements for different types of faults, such as single point faults and latent faults. Additionally, certain applications may require different fault reporting time (sometimes referred to as fault tolerant time) within which a fault must be deleted by the sensor. Non-homogeneous processing channels 16, 18 may have different processing accuracies and still meet fault performance requirements. For example, the primary processing channel 16 can implement more accurate sensing than the secondary processing channel 18. It will be appreciated that even with one or more non-homogeneities between the processing channels 16, 18, the channels can be designed to have the same or different accuracies to generate the respective first and second processed signals 30a, 30b.

Each processing channel 16, 18 includes at least a respective signal path, such as first signal path 24a in processing channel 16 and second signal path 24b in the second processing channel 18. Processing channels 16, 18 may additionally include a respective amplifier 22a, 22b, as shown.

Each processing channel 16, 18 is responsive to an analog signal that is generated by a sensing element or a plurality of sensing elements, here illustrated as sensors 12, 14. In some embodiments, each processing channel 16, 18 is responsive to a respective analog signal 20a, 20b generated by a respective sensor 12, 14 and, in other embodiments, each processing channel 16, 18 is responsive to the same analog signal (e.g., signal 20a) generated by the same sensor 12. One example application in which the processing channels 16, 18 may respond to the same analog signal is a three-phase motor controller in which the sensor providing the analog signal to both processing channels is a shunt resistor configured to measure the phase current. The sensor(s) 12, 14 can form part of (i.e., be integrated with or internal to) the sensor IC 10 or, alternatively, can be external to the sensor IC 10, as will be explained.

In general, the sensors 12, 14 include one or more sensing elements to sense an external parameter. As examples, in some embodiments, sensors 12, 14 include one or more magnetic field sensing elements, or transducers to sense a magnetic field, such as a magnetic field as may be affected by movement of a target object or as may result from a current flow through a conductor. Other types of devices may provide the sensing element(s). For example, the sensor(s) may comprise a resistor, as may be configured to generate a voltage signal indicative of a current flow, an optical sensing element, or a pressure sensing element.

The sensor IC 10 responding to analog signals generated by such sensors 12, 14 can be used in a variety of applications including, but not limited to, an angle sensor that senses an angle of a direction of a magnetic field, a current sensor that senses a magnetic field generated by a current through a conductor, a magnetic switch that senses the proximity of a an object, a rotation detector that senses features of a rotating object, for example, magnetic domains of a ring magnet or a ferromagnetic target (e.g., gear teeth) where the magnetic field sensor is used in combination with a back-biased or other magnet, a linear magnetic field sensor that senses a magnetic field density of a magnetic field, a pressure sensor, an optical detector, and motor control circuits.

In embodiments in which the sensors 12, 14 contain one or more magnetic field sensing elements, such elements can be, but are not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR, including spin-valve structures) element, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

Sensor IC 10 generates one or more output signals. For example, one or both of the first processed signal 30a from the first signal path 24a and the second processed signal 30b from the second signal path 24b may be provided to circuits and systems external to the IC 10 in order to thereby provide an indication of the parameter sensed by sensors 12, 14. Additionally, the checker circuit 34 may provide a fault signal 42 which may be coupled to external circuits and systems for further processing or action. In some embodiments, the fault signal 42 from the checker circuit 34 may be combined with the first and/or second processed signals 30a, 30b in order to provide a "composite" output signal, or signals that conveys information about the parameter sensed by the sensor IC 10 as well as fault information.

The particular signal processing functionality of the primary and secondary processing channels 16, 18 used to generate the sensor IC output signals depends on the sensed parameter and purpose of the IC 10. For example, in embodiments in which the sensor IC 10 forms a current sensor, the processing channels 16, 18 may amplify an analog voltage signal generated by a sensor in the form of one or more magnetic field sensing elements or resistors, which analog voltage signal has a magnitude indicative of a level of a current through a conductor, as will be described in connection with the example embodiment of FIG. 1A. As another example, in embodiments in which the sensor IC 10 forms an angle sensor, the processing channels 16, 18 may respond to analog signals from one or more magnetic field sensing elements and may compute an arctangent of a digitized version of the magnetic field signals in order to thereby determine the angle of the magnetic field, as will be described in connection with the example embodiment of FIG. 1B.

The above-described arrangements can be provided with various options in order to suit a particular application and/or safety requirements. Optional elements and connections are illustrated in the figures by certain dotted line connections and element outlines.

In some embodiments, the sensor IC 10 additionally includes a second checker circuit 36. The second checker circuit 36, like the first checker circuit 34, is responsive to the first processed signal 30a and the second processed signal 30b and is configured to detect a fault in the sensor IC 10 when the first processed signal 30a and the second processed signal 30b differ from each other by more than a predetermined amount. The fault signal 44 generated by the second checker circuit 36 can be provided as an output signal of the IC 10 to external circuits and/or systems.

In some embodiments utilizing both first and second checker circuits 34, 36, the fault signals 42, 44 generated by each checker circuit can be coupled to a logic circuit (here, logic or gate 40) to thereby generate a fault signal 46 indicative of a fault in the sensor IC 10 when either fault signal 42 or fault signal 44 indicates a fault condition in the sensor IC. In such embodiments, the output signal 46 of logic circuit 40 can be provided as a further (or alternative) output signal of the IC 10 to external circuits and/or systems. Furthermore, the first and second checker circuits 34, 36 can be identical or can be non-homogenous checker circuits.

The sensor IC 10 generally includes one or more semiconductor die supporting electronic circuitry, a lead frame having a plurality of leads through which electrical connections can be made to the IC circuitry from outside of the IC, and may optionally include additional discrete components. Portions of the IC 10, including at least the semiconductor die and a portion of the lead frame, are enclosed by a non-conductive mold material that forms the IC package, while other portions (such as connection portions of leads) are not enclosed by the mold material and permit access to connection points within the IC.

Dotted line boxes 50, 50a, 50b, 50c, and 50d, and 60 represent possible individual semiconductor die within the sensor IC package. As noted above, the sensor(s) 12, 14 may be internal to the sensor IC 10 or, alternatively, may be external to the IC. Many variations are possible in terms of partitioning of the described circuitry on one or more die and which variation is adopted generally will be based on safety requirements and space and cost considerations.

In some embodiments, the IC 10 contains only a single semiconductor die (here including boxes 50b and 50d) supporting the first processing channel 16, the second processing channel 18, and the checker circuit 34. In such single die embodiments in which one or both sensors 12, 14 are internal to the IC, the single die can additionally support sensors 12, 14, in which case such single die can represented by box 50.

In other embodiments, the IC 10 can contain multiple semiconductor die, each supporting a portion of the circuitry and provided in the same package as the other die. Considering first multi-die embodiments in which the sensor(s) 12, 14 are external to the IC 10, one such example embodiment has the first processing channel 16 and the first checker circuit 34 supported by a first die 50b and the second processing channel 18, the second checker circuit 36, and logic circuit 40 supported by a second die 50d In multi-die embodiments in which the sensor(s) 12, 14 are contained within the IC 10, one such example embodiment has the first sensor 12, first processing channel 16, and the first checker circuit 34 supported by a first die represented by boxes 50a and 50b and the second sensor 14, second processing channel 18, the second checker circuit 36, and logic circuit 40 supported by a second die represented by boxes 50c and 50d. It will be appreciated that the particular partitioning of circuitry amongst multiple semiconductor die can be varied.

In some embodiments, it may be desirable in provide additional redundancy by duplicating the above-described circuitry shown within box 50 or within boxes 50b, 50c. In one such example, the sensor IC 10 contains all the circuitry within box 50 and a duplicate of such circuitry within identical box 60. More particularly, in one such example of this type, a first semiconductor die 50 can support the first sensor 12, the second sensor 14, the first processing channel 16, the second processing channel 18, and the checker circuit 34. A second semiconductor die (within the same IC package) as may be represented by box 60 can support a third sensor that is the same as or similar to the first sensor 12, a fourth sensor that is the same as or similar to the second sensor 14, a third processing channel that is the same as or similar to the first processing channel 16, and a fourth processing channel that is the same as or similar to the second processing channel 18, and a checker circuit that is the same as or similar to the checker circuit 34. With this arrangement, an additional level of redundancy and safety integrity can be achieved since the fault signals from the two identical die will provide an indication of which die can be "trusted" to provide the IC output. In other words, if the checker circuit from one die indicates a fault and the checker circuit from the other die does not indicate a fault, then system operation can continue on the basis of the output signal from the die on which no fault is detected.

Figure 1A:
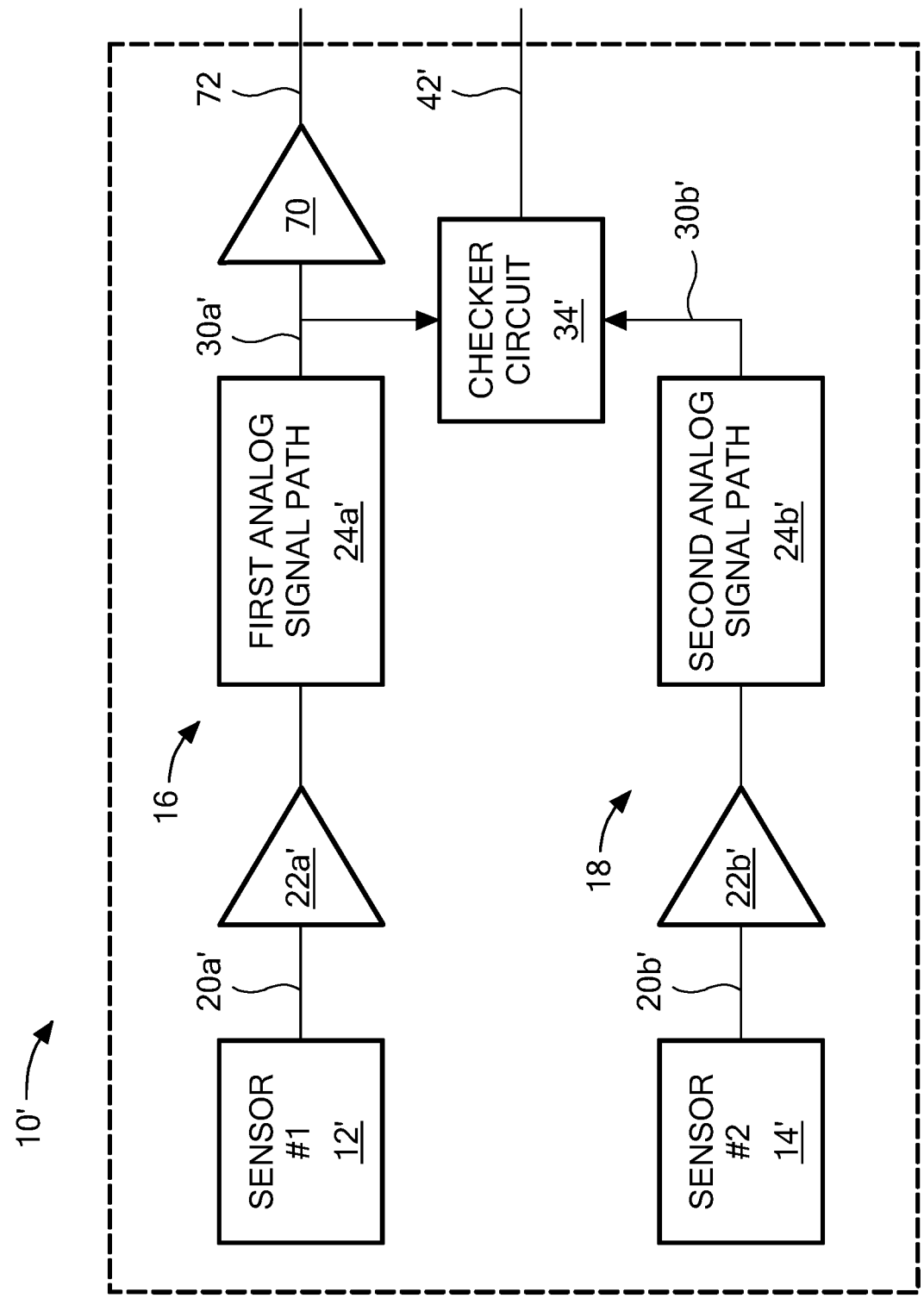
FIG. 1A is a block diagram of an example analog sensor integrated circuit.

Referring to FIG. 1A, an example sensor IC 10' is provided in the form of an analog sensor, such as a linear magnetic field sensor or a current sensor. In an embodiment, sensor 12' comprises one or more magnetoresistance elements, such as a GMR element, and sensor 14' comprises one or more Hall effect elements, such as a vertical Hall element. Each sensor 12', 14' generates a respective analog magnetic field sensing signal 20a', 20b' for coupling to a respective processing channel 16', 18'. For example, each such magnetic field signal 20a', 20b' may take the form of a substantially sinusoidal signal generated in response to a magnetic field, such as a magnetic field generated by a current flow through a proximate conductor (not shown).

Primary processing channel 16' includes an amplifier 22a' and a first signal path 24a' and secondary processing channel 18' includes an amplifier 22b' and a second signal path 24b'. In an embodiment, each of the signal paths 24a', 24b' takes the form of an analog filter. For example, signal path 24a' may be a switched capacitor filter and signal path 24b' may be an RC filter. Thus, a first processed signal 30a' generated by the first signal path 24a' may be an analog filtered signal and the second processed signal 30b' generated by the second signal path 24b' may be an analog filtered signal, but filtered with a different filter type than the first processed signal 30a'.

A buffer 70 coupled to the output of the first analog signal path 24a' provides a sensor output signal 72 as may be coupled to circuits and systems external to the sensor IC 10'. Thus, in this example, the magnetic field detected by GMR sensor 12' is filtered by signal path 24' to provide the sensor IC output signal 72.

The second processing channel 18' is provided for non-homogenous redundancy in order to permit detection of a fault in the first processing channel 16'. It will be appreciated however, that the processed signal 30b' also could be provided to circuits and systems external to the sensor IC 10' in order to thereby provide redundant output signals.

Figure 2:
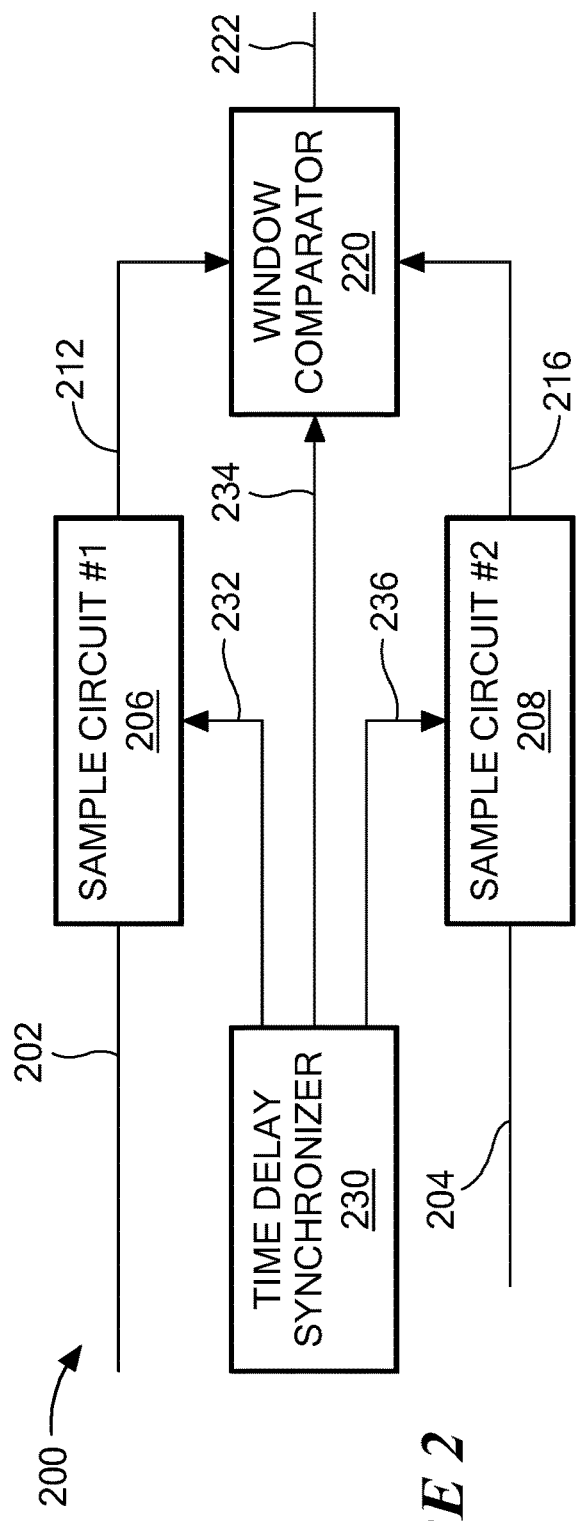
FIG. 2 is a block diagram of an example checker circuit.

The checker circuit 34' has inputs coupled to receive the first processed signal 30a' and the second processed signal 30b' and generates fault signal 42' at an output, as shown. Various types of checker circuits are possible. A suitable example analog checker circuit 34' for the analog sensor IC 10'' is shown in FIG. 2 and described below. Suffice it to say here that the checker circuit 34' performs a comparison of the first processed signal 30a' and the second processed signal 30b' and generates the fault signal 42' indicative of a fault in the sensor IC if the signals 30a', 30b' differ by more than a predetermined amount. It will be appreciated that while the analog sensor IC 10' of FIG. 1A includes only one checker circuit 34', a second checker circuit (e.g., checker circuit 36 of FIG. 1) could be provided.

Sensor 10' is an example of a sensor in which processing channels 16 and 18 differ in a more than one way (i.e., have more than one non-homogeneity). In particular, the first processing channel 16' contains a different circuit type than the second processing channel 18' (i.e., switched capacitor filter 24a' is different than RC filter 24b'). Additionally, the first processing channel 16' is responsive to an analog signal 20a' from a first sensor type (e.g., a GMR element) and the second processing channel 18' is responsive to an analog signal 20b' from a second sensor type, different than the first sensor type (e.g., a vertical Hall effect element).

Figure 1B:
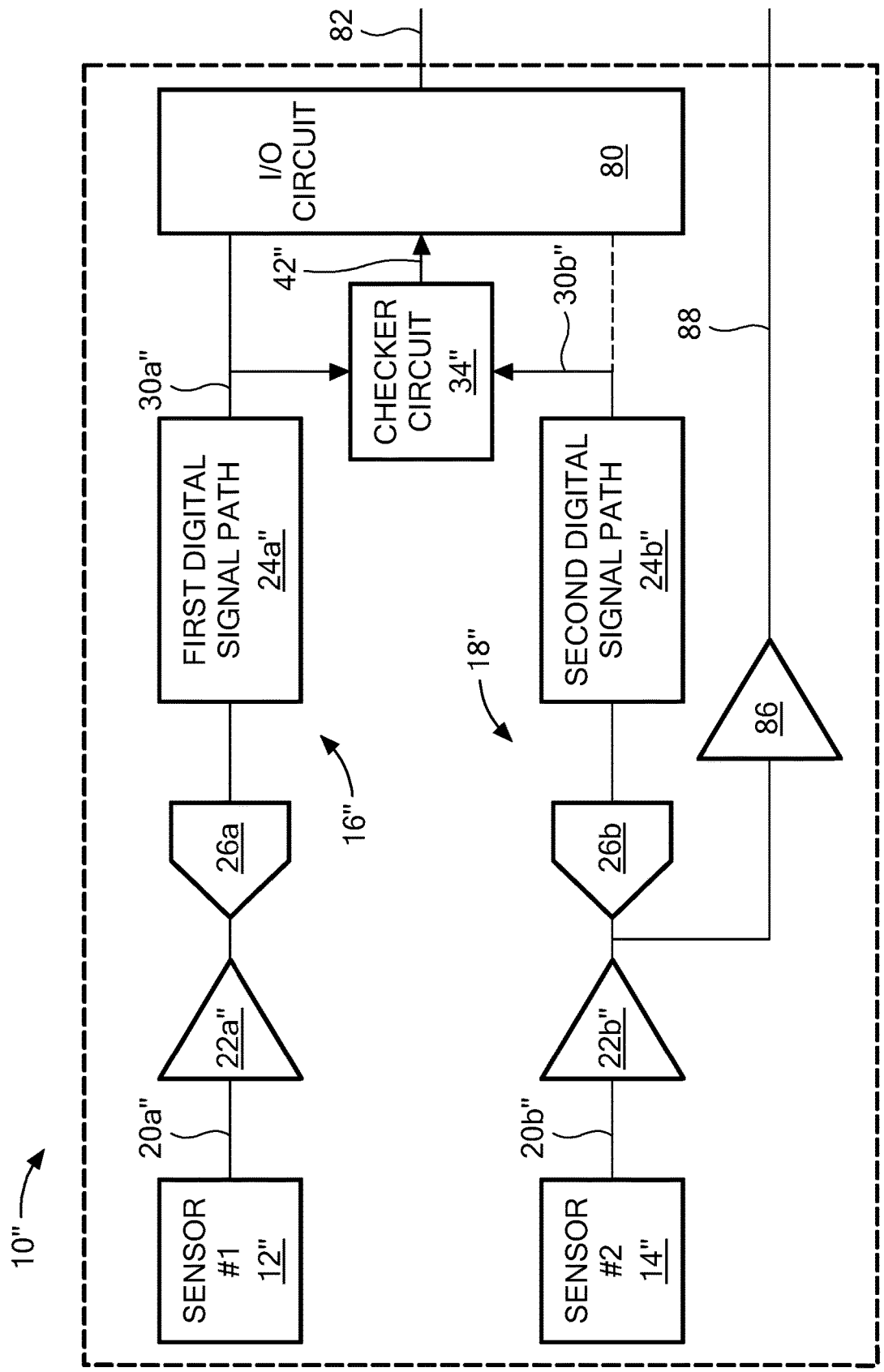
FIG. 1B is a block diagram of an example digital sensor integrated circuit.

Referring to FIG. 1B, an example sensor IC 10'' is provided with digital signal paths 24a'' and 24b''. Digital sensor IC 10'' may take various forms to perform signal processing functionality on analog input signals 20a'', 20b'' from sensors 12'', 14'', as shown. As examples, sensor IC 10'' may be an angle sensor to sense the angle of a magnetic field direction, a speed sensor to sense a speed of movement such as rotation of a target object, or a motor controller configured to sense motor phase current.

In an embodiment, sensor IC 10'' is an angle sensor and sensor 12'' comprises a Circular Vertical Hall (CVH) element and sensor 14'' comprises one or more planar Hall effect elements, as will be explained in connection with FIGS. 4 and 4A. Each sensor 12'', 14'' generates a respective magnetic field sensing signal 20a'', 20b'' for coupling to a respective processing channel 16'', 18''. For example, each such magnetic field signal 20a'', 20b'' may take the form of a substantially sinusoidal signal as may be generated in response to a magnetic field, the angle of which is to be determined.

Processing channel 16'' includes an amplifier 22a'', an analog-to-digital converter (ADC) 26a, and a first digital signal path 24a''. Processing channel 18'' includes an amplifier 22b'', an ADC 26b, and a second digital signal path 24b''. More particularly, the first digital signal path 24a'' is coupled to receive a digital output signal from ADC 26a and generates the first processed signal 30a'' and the second digital signal path 24b is coupled to receive a digital output signal from ADC 26b and generates the second processed signal 30b''.

Figure 3:
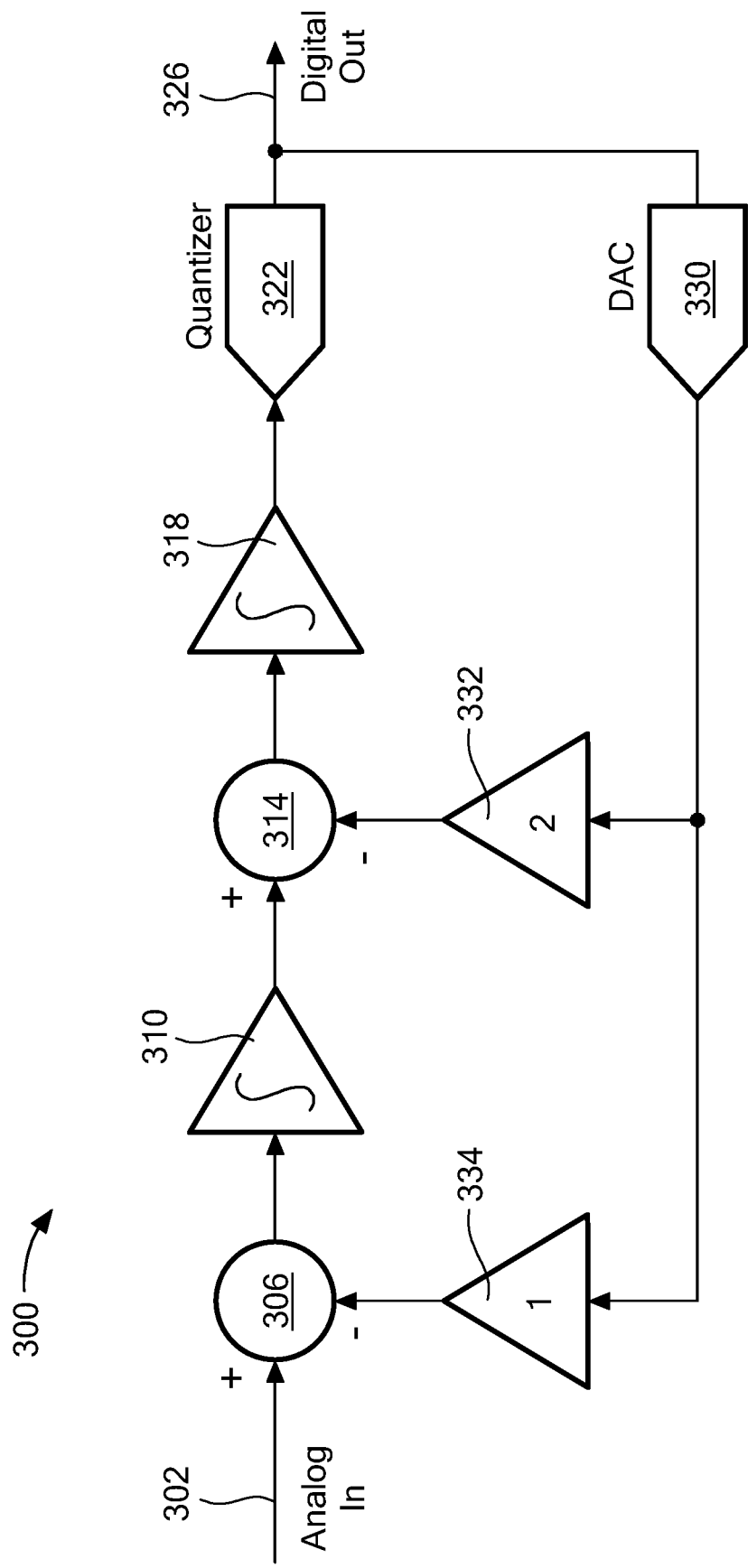
FIG. 3 is a schematic of an example analog-to digital converter.
Figure 3A:
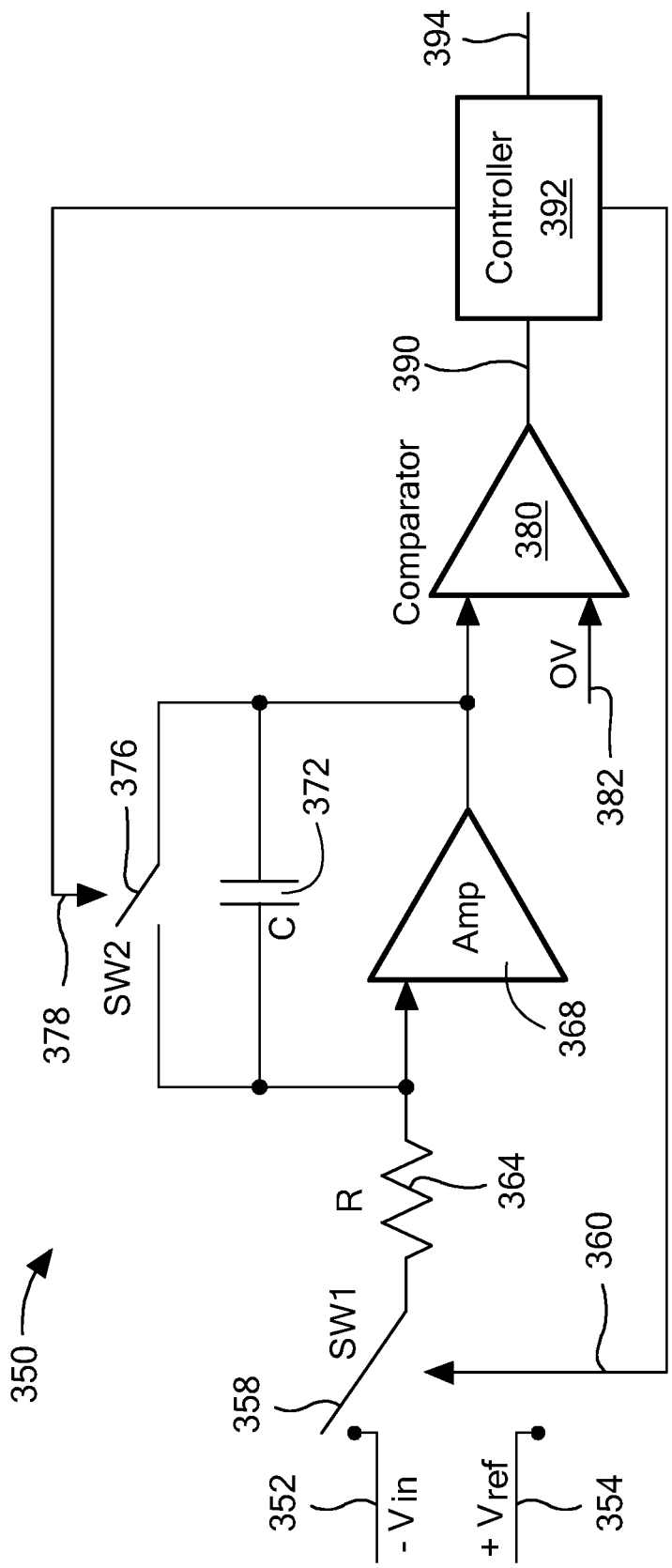
FIG. 3A is a schematic of an alternative analog-to digital converter.

Each processing channel 16'', 18'' may include a different type of ADC 26a, 26b. For example, ADC 26a may take the form of a sigma-delta ADC as shown in FIG. 3 and ADC 26b may take the form of a dual slope ADC as shown in FIG. 3A, both of which are described below. In this example embodiment, ADC 26a may have a faster data conversion rate than ADC 26b. Other types of ADCs are also possible, such as successive approximation ADCs for example.

Each of the digital signals paths 24a'', 24b'' may implement a different sensing methodology to process the input digital magnetic field signal samples and generate a respective processed signal 30a'', 30b'' indicative of the angle of the sensed magnetic field. In an embodiment, the first digital signal path 24a" processing the CVH generated magnetic field signal 20a" includes a zero crossing detector such as that shown in FIG. 4 and the second digital signal path 24b" processing orthogonal magnetic field signal generated by respective orthogonally positioned vertical Hall effect elements includes a CORDIC processor such as that shown in FIG. 4A, both of which are described below. Other types of sensing methodologies may be used to generate a processed signal indicative of the angle of the sensed magnetic field, such as methodologies including the use of a Phase Locked Loop (PLL).

Figure 2A:
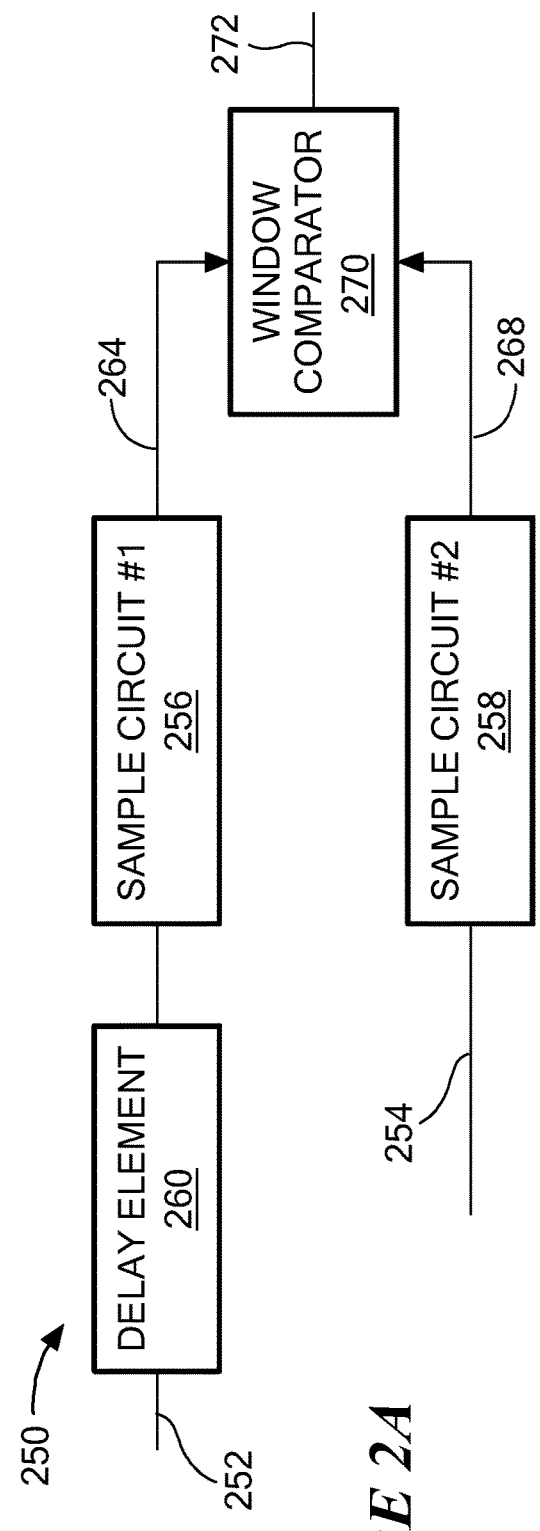
FIG. 2A is a block diagram of an alternative checker circuit.

The checker circuit 34" has inputs coupled to receive the first processed signal 30a" and the second processed signal 30b" and generates fault signal 42" at an output, as shown. Various types of checker circuits are possible. A suitable example digital checker circuit 34" for the digital sensor IC 10" is shown in FIG. 2A and described below. Suffice it to say here that the checker circuit 34" performs a comparison of the first processed signal 30a" and the second processed signal 30b" and generates the fault signal 42" indicative of a fault in the sensor IC if the signals 30a", 30b" differ by more than a predetermined amount. It will be appreciated that while the digital sensor IC 10" of FIG. 1B includes only one checker circuit 34", a second checker circuit (e.g., checker circuit 36 of FIG. 1) could be provided.

The fault signal 42" and each of the first and second processed signals 30a", 30b" are coupled to an Input/Output (I/O) circuit 80, which circuit provides an output signal 82 of the sensor, as shown. The I/O circuit 80 may include a digital register configured to provide the sensor output signal 82 in a format compatible with the external circuits or systems. As examples, the sensor output signal 82 can provide the sensed magnetic field angle from signals 30a" and/or 30b" and fault information encoded in various known communication formats or protocols, including Controller Area Network (CAN), Single Edge Nibble Transmission (SENT), Manchester, Serial Peripheral Interface (SPI), Inter-Integrated Circuit (I$^2$C), etc. More particularly, the sensor output signal 82 can be a composite output signal, such a digital word that conveys information about the parameter sensed by the sensor(s) as well as fault information.

Figure 1C:
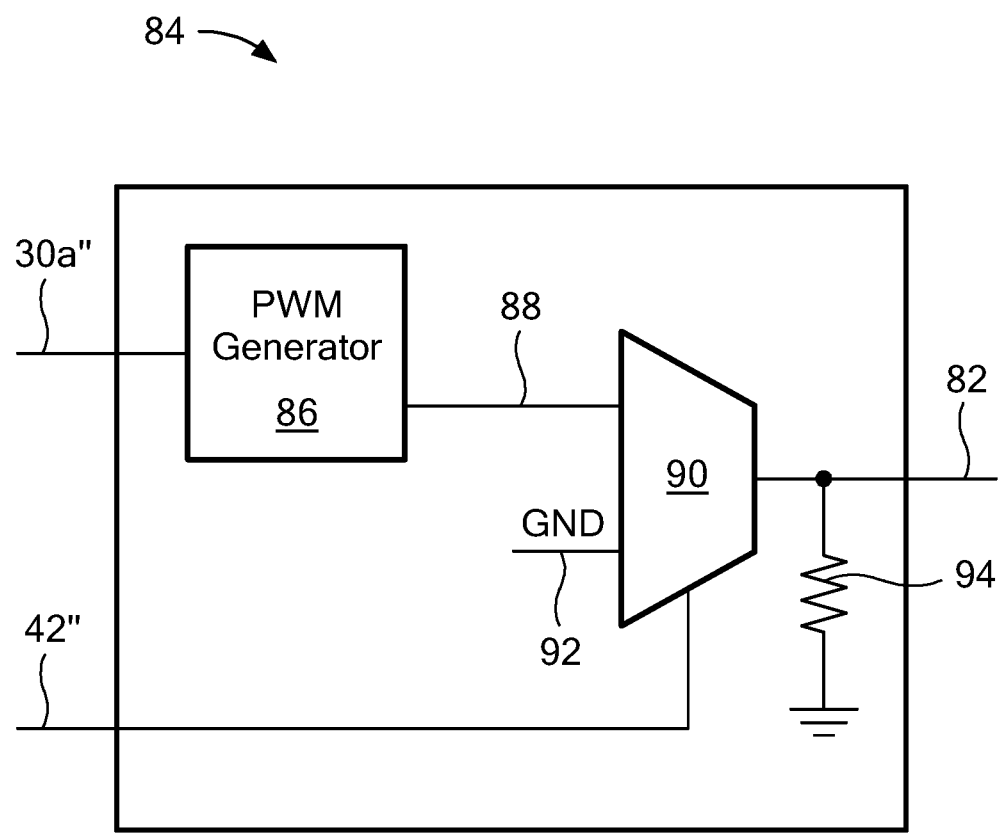
FIG. 1C is a block diagram of an example I/O circuit configuration for the digital sensor integrated circuit of FIG. 1B.

Referring also to FIG. 1C, an example I/O circuit 84 as may provide the I/O circuit 80 in FIG. 1B is configured to generate sensor output signal 82 with a PWM signal format. I/O circuit 84 includes a PWM generator 86, a multiplexer 90, and a pull-down resistor 94. More particularly, the processed signal 30a" from the primary processing channel 16" is coupled to the PWM generator 102, which generator generates a PWM output signal 82 (i.e., a digital pulse train or square wave signal) having a duty cycle that varies according to the value of the digital processed signal 30a".

The fault output signal 42" (FIG. 1B) of the checker circuit 34" controls the multiplexer 90 so that, depending on the state of the fault output signal 42", the multiplexer 90 couples either the PWM generator output signal 88 or a reference signal, such as ground 92 to the sensor IC output 82. More particularly, if the fault signal 42" is at a level indicative of an IC fault, then the sensor output 82 can be coupled to ground; whereas, if the fault signal 42" is at a level not indicating the existence of a fault, then the PWM generator output signal 88 can be coupled to the sensor output 82. Pull-down resistor 94 has a high enough impedance so as not to interfere with normal operation such that when the PWM signal 88 is active and is coupled to the sensor output 82, the PWM signal 88 provides the sensor output signal 82.

With this arrangement, the absence of a PWM signal at the sensor output 82 can be interpreted to indicate the existence of a fault other than a fault due to the processed signals 30a", 30b" differing by more than the predetermined amount. As one example, if an internal regulator within the IC 10" were to fail, then conceivably both signal paths 16", 18" and the checker circuit 34" would fail. In this scenario, even though the checker circuit 34" is no longer functional to provide a fault indicator or flag, the pull-down resistor 94 would keep the sensor IC output 82 low, thereby permitting the absence of the PWM output signal to occur under additional conditions beyond just the fault condition flagged by the fault signal 42".

Sensor 10" is an example sensor in which processing channels 16" and 18" differ in a more than one way (i.e., have more than one non-homogeneity). In particular, the first processing channel 16" contains a different circuit type than the second processing channel 18" (i.e., sigma-delta ADC 26a is different than dual slope ADC 26b) is shown. Additionally, the first processing channel 16" is responsive to an analog signal 20a" from a first sensor type (e.g., a CVH element) and the second processing channel 18" is responsive to an analog signal 20b" from a second sensor type, different than the first sensor type (e.g., a vertical Hall effect element). Furthermore, each processing channel 16", 18" implements a different sensing methodology (i.e., digital signal path 24a" uses zero crossing detection to determine magnetic field angle and digital signal path 24b" uses arctangent computation with a CORDIC processor).

As noted above, the digital sensor IC 10" could take the form of a speed sensor. For example, in embodiments, the first digital signal path 24a" and the second digital signal path 24b" can include different types of peak detectors (e.g., a so-called peak-to-peak percentage detector, a peak-referenced detector, or a threshold detector). In this example, each of the processed signals 30a", 30b" may take the form of a digital pulse train with a period indicative of the speed of a target.

Example checker circuits are shown in FIGS. 2 and 2A. Since the processing channels 16, 18 are non-homogenous and may have different accuracies which, in some embodiments can result in processed signals 30a, 30b having different speeds, the checker circuit 34 is configured to address such channel mismatches in order to permit accurate comparison of the processed signals. As will become apparent, the checker circuit 200 of FIG. 2 addresses channel mismatches essentially by "waiting" for the slower channel before sampling and the checker circuit 250 of FIG. 2A addresses channel mismatches essentially by "delaying" the faster channel before sampling.

Referring to FIG. 2, an example checker circuit 200 includes a first sample circuit 206, a second sample circuit 208, a time delay synchronizer 230, and a window comparator 220. The checker circuit 200 is responsive to input signals 202, 204 (which may be the same as or similar to analog processed signals 30a', 30b' of FIG. 1A or to digital processed signals 30a", 30b" of FIG. 1B) and is configured to generate an output signal 222 (which may be the same as or similar to fault signal 42' of FIG. 1A or to fault signal 42" of FIG. 1B).

Sample circuit 206 samples input signal 202 to provide sampled signal 212 to an input of the window comparator 220 and sample circuit 208 samples the input signal 204 to provide sampled signal 216 to an input of the window comparator 220. In embodiments in which the checker circuit 200 is provided in an analog sensor IC (e.g., IC 10' of FIG. 1A), sample circuits 206, 208 may comprise sample and hold circuits, as may include a switch and capacitor whereby charge from the analog input signal is selectively stored on the capacitor when the switch is closed and held on the capacitor when the switch is open. In embodiments in which the checker circuit 200 is provided in a digital sensor IC (e.g., IC 10" of FIG. 1B), sample circuits 206, 208 may comprise a digital register or other suitable digital storage.

The time delay synchronizer 230 generates one or more synchronizing, or clock signals, here signals 232, 234, 236, for coupling to an input of sample circuits 206, 208, and also to an input of the window comparator 220, as shown. As noted above, the processed signals providing checker input signals 202, 204 (e.g., processed signals 30a', 30b' of FIG. 1A or processed signals 30a", 30b" of FIG. 1B) may result from different processing speeds and thus, may themselves have different speed characteristics. Accordingly, the synchronizing signals 232, 236 control the respective sample circuits 206, 208 (e.g., control respective switches in the sample and hold circuits) in order to ensure that the sampled signals 212, 216 have the same speed for comparison by window comparator 220. For example, if input signal 202 has a speed twice as fast as input signal 204, synchronizing signal 236 may control sample circuit 208 to sample input signal 202 twice as fast as synchronizing signal 232 controls sample circuit 206 to sample input signal 204 in order to thereby generate sampled signals 212, 216 with the same speed. Synchronizing signal 234 is coupled to the window comparator 220 and controls the time of comparison between the sampled signals 212, 216.

Window comparator 220 is configured to compare the sampled signals 212, 216 and to generate fault signal 222 to indicate a fault if the signals 212, 216 differ by more than a predetermined amount. In this configuration, one of the sampled signals 212, 216 provides the comparator threshold voltage and the other sampled signal provides the comparator input. With this configuration, the comparator output signal 222 is provided in a first logic state when the difference between the first and second sampled signals 212, 216 is less than a predetermined amount, as may be established by a resistor divider within the window comparator, and is in a second logic state when the difference between the first and second sampled signals 212, 216 is greater than the predetermined amount. In embodiments, the predetermined amount may be specified in terms of an absolute acceptable variation of the sensor output (e.g., in an angle sensor, the predetermined amount may correspond to a magnetic field angle error of 10° for example). In some embodiments, the predetermined amount can be a percentage difference (e.g., in an angle sensor, the predetermined amount can correspond to the sensor output being within 5% of the actual magnetic field angle). The predetermined amount can also be a programmable or selectable value.

It will be appreciated that the fault signal 222 can take various forms, such as a logic signal having levels as set forth above depending on the difference between the first and second sampled signals 212, 216. As an alternative for example, the fault signal 222 can take the form of a flag that is set when the difference between the sampled signals 212, 216 differs by the predetermined amount and is not cleared until some system function occurs or until cleared by a system processor, for example.

Referring to FIG. 2A, an alternative checker circuit 250 includes a first sample circuit 256, a second sample circuit 258, a delay element 260, and a window comparator 270.

The checker circuit 250 is responsive to input signals 252, 254 (which may be the same as or similar to analog processed signals 30a', 30b' of FIG. 1A or to digital processed signals 30a", 30b" of FIG. 1B) and is configured to generate an output signal 272 (which may be the same as or similar to fault signal 42' of FIG. 1A or to fault signal 42" of FIG. 1B).

Delay element 260 is coupled in series between input signal 252 and sample circuit 256 in order to delay such input signal for sampling by sample circuit 256. In embodiments in which checker circuit 250 provides the checker circuit 34' (FIG. 1A) for example, such that input signals 252, 254 are provided by processed signals 30a', 30b', respectively, the processed signal 30a' can be delayed so as to provide a signal with the same speed as input signal 30b' for further processing. For example, if input signal 252 has a speed twice as fast as input signal 254, then delay element 260 can delay input signal 252 so as to have the same speed as the input signal 254. Thus, it is contemplated that the delay element 260 is provided in series with the faster of the two processing channels. In embodiments, an Exclusive-OR (XOR) logic circuit can be provided to effectively couple the delay element 260 in series with a selected (i.e., faster) one of the processing channels.

It will be appreciated that in some embodiments, a second delay element (not shown) additionally may be provided in series with the slower processing channel in order to permit adjustment of the slower processed signal as well, in order to thereby generate input signals for sample circuits 256, 258 that have approximately the same speed for subsequent sampling.

Sample circuits 256, 258 can be the same as or similar to sample circuits 206, 208 so as to provide respective sampled signals 264, 268 for coupling to inputs of window comparator 270, as shown. Thus, in embodiments in which the checker circuit 250 forms part of an analog sensor IC (e.g., IC 10' of FIG. 1A), sample circuits 256, 258 may comprise sample and hold circuits and, in embodiments in which the checker circuit 250 is provided in a digital sensor IC (e.g., IC 10" of FIG. 1B), sample circuits 256, 258 may comprise a digital register or other suitable digital storage.

Window comparator 270 can be the same as or similar to window comparator 220 (FIG. 2) and is configured to compare the sampled signals 264, 268 and to generate fault signal 272 to indicate a fault if the signals 264, 268 differ by more than a predetermined amount, which here again may take the form of a predetermined absolute amount or a predetermined percentage as examples. Fault signal 272 which can be the same as or similar to fault signal 222 can take various forms.

As noted above in connection with FIG. 1B, each processing channel 16", 18" may include a different (i.e., non-homogenous) type of ADC 26a, 26b. The particular ADC type selected for each processing channel is based on at least the accuracy and speed of the ADC in order to meet the application requirements for the primary and secondary channels 16", 18".

Referring to FIG. 3, an example ADC 300 in the form of a second order sigma-delta converter may provide ADC 26a (FIG. 1B). ADC 300 includes a forward path containing summation elements (e.g., differential amplifier) 306, 314, integrators 310, 318, and a quantizer 322 generating a digital output signal 326. A first feedback path from the digital output signal 326 to the first summation element 306 includes a digital-to-analog converter (DAC) 330 and a gain stage (i.e., feedback coefficient) 334. A second feedback path from the digital output signal 326 to the second summation element 314 includes DAC 330 and a feedback coefficient 332, as shown.

By operation of the ADC 300, the digital output signal 326 has a value proportional to the level of the analog input signal 302. In an embodiment in which the sigma-delta ADC 300 of FIG. 3 provides the ADC 26a of FIG. 1B, the ADC input signal 302 can correspond to the output of amplifier 22a" and the digital output signal 326 of the ADC provides the digital input signal to the primary digital signal path 24".

Referring to FIG. 3A, an example ADC 350 in the form of a dual-slope converter may provide ADC 26b (FIG. 1B). ADC 350 includes a switch 358 configured to selectively couple an analog input voltage 352 or a reference voltage (of opposite polarity to the input voltage) 354 to an integrator under the control of a control signal 360. The integrator includes an operational amplifier 368, resistor 364, and capacitor 372. A switch 376 coupled in parallel with the capacitor 372 periodically resets the capacitor voltage under the control of a control signal 378. The output of amplifier 368 is coupled to an input of a comparator 380, which comparator has a second input coupled to a reference voltage 382 as may form a zero crossing detector to provide a comparator output signal 390 to a controller 392. Controller 392 is responsive to the comparator output signal 390 and generates the switch control signals 360, 378 and ADC output signal 394. Control signal 360 causes switch 358 to couple the analog input voltage 352 to the integrator for a fixed time, following which the control signal 360 causes the switch 358 to couple the reference voltage 354 to the integrator. A transition of the comparator output signal 390 indicates that the capacitor voltage has returned to zero and the time it takes for the output of the integrator 368 to return to zero is measured by the ADC controller 392 to provide digital output signal 394 having a value proportional to the level of the analog input voltage 352.

It will be appreciated that the sigma-delta ADC 300 of FIG. 3 and the dual-slope ADC 350 of FIG. 3A can be designed to achieve a desired speed and/or accuracy for the respective processing channel in which the ADCs are used. Non-homogeneity is achieved simply by using different types of ADCs in the two processing channels (e.g., channels 16", 18" of FIG. 1B). Additional non-homogeneity can be achieved by design choices selected to provide different accuracies (e.g., resolutions) and/or different conversion speeds.

As explained above in connection with FIG. 1B, each of the digital signals paths 24a", 24b" may implement a different sensing methodology to process the input digital magnetic field signal samples and generate a respective processed signal 30a", 30b". For example, in angle sensor embodiments, in which both digital signal paths process a sensed magnetic field to generate an angle measurement signal, each may do so according to a different sensing methodology.

Figure 4:
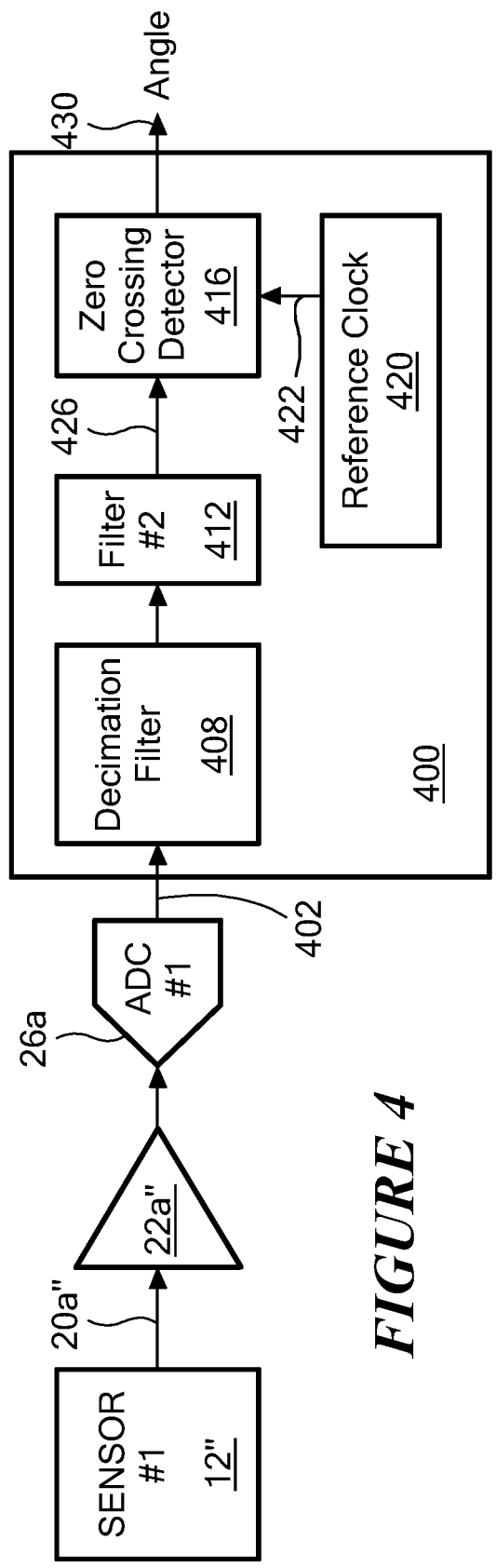
FIG. 4 is a block diagram of an example digital signal path.

Referring to FIG. 4, one such angle sensing methodology can be achieved with digital signal path 400 (which path may provide digital signal path 24a" of FIG. 1B). In this embodiment, sensor 12" can be a CVH element providing magnetic field signal 20" to amplifier 22a", the output of which is converted into a digital signal 402 by ADC 26a (FIG. 1B).

The digital signal path 400 may include a decimation filter 408, a further filter 412, a zero crossing detector 416, and a reference clock generator 420. Digital signal path 400 is responsive to the digital input signal 402 which represents a digitized version of the substantially sinusoidal output of the CVH sensor 12". The digitized signal 402 is filtered by filters 408 and 412 and the filtered signal 426 is coupled to zero crossing detector 416. In response to a reference signal 422 from reference clock generator 420, the zero crossing detector 416 determines when the filtered signal 426 crosses the zero reference point. Since phase shift between transitions of the zero crossing detector and the reference signal 422 are proportional to the magnetic field angle, the output signal 430 of the zero crossing detector 416 thus, is indicative of the angle of the sensed magnetic field.

Figure 4A:
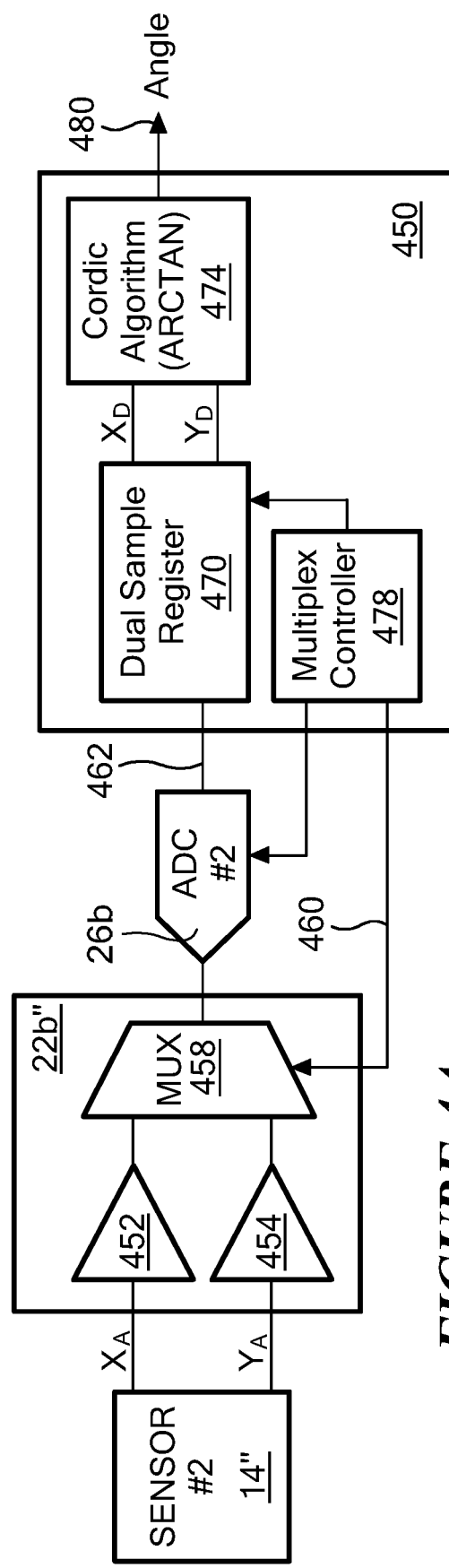
FIG. 4A is a block diagram of an alternative digital signal path.

Referring to FIG. 4A, an alternative angle sensing methodology can be achieved with digital signal path 450 (which path may provide digital signal path 24b" of FIG. 1B). In this embodiment, sensor 14" can include a dual vertical Hall effect configuration providing analog magnetic field signals $X_A$, $Y_A$ (collectively signals 20b", FIG. 1B) to an amplifier circuit (collectively amplifier 22b", FIG. 1B). In this example, the sensor 14" may include a pair of Hall effect elements positioned orthogonally with respect to each other such that an output signal $X_A$ of one of the elements represents the magnetic field as sensed with respect to a first, x-axis and an output signal $Y_A$ of the other element represents the magnetic field as sensed with respect to a second, orthogonal, y-axis. Amplifier circuit 22b" includes an amplifier 452 coupled to the first sensor output signal $X_A$, an amplifier 454 coupled to the second sensor output signal $Y_A$, and a multiplexer 458 that selectively couples one of the amplifier output signals to the digital signal path 450 under control of control signal 460. The output of amplifier circuit 22b" is converted into a digital signal 462 by ADC 26b (FIG. 1B).

Digital signal path 450 can include a dual sample register 470, a CORDIC processor 474, and a multiplexer controller 478. Multiplexer controller 478 applies control signals to the multiplexer 458, the ADC 26b, and the dual sample register 479 in order to synchronize operation of the ADC 26b and the dual sample register 470 to thereby generate quadrature digital signals $X_D$, $Y_D$ representing digitized samples of respective analog magnetic field signals $X_A$, $Y_A$. Having generated quadrature signals $X_D$, $Y_D$, the CORDIC processor 474 computes the arctangent of the quadrature signals $X_D$, $Y_D$ in order to thereby generate a channel output signal 480 having a value indicative of the angle of the sensed magnetic field.

It will be appreciated that at least due to the time multiplexing associated with the digital signal path 450 of FIG. 4A, this digital signal path 450 can be slower than the angle sensing performed by the digital signal path 400 of FIG. 4. This slower processing can be sufficient for use in the secondary processing channel 18" (FIG. 1B) in order to thereby achieve non-homogenous redundancy, as long as the angle sensing by the path 450 is fast enough to meet the fault tolerant time requirement.

All references cited herein are hereby incorporated herein by reference in their entirety.

Having described preferred embodiments, it will now become apparent to one of ordinary skill in the art that other embodiments incorporating their concepts may be used.

For example, it will be appreciated that while the sensor ICs of FIGS. 1, 1A, and 1B are shown to have two processing channels, more than two processing channels could be used, if cost and space considerations permit.

It is felt therefore that these embodiments should not be limited to disclosed embodiments, but rather should be limited only by the spirit and scope of the appended claims.

What is claimed is:

1. A sensor integrated circuit comprising:
   a first processing channel responsive to a first analog signal to generate a first processed signal, wherein the first analog signal is provided by a first type of sensing element;
   a second processing channel responsive to a second analog signal to generate a second processed signal, wherein the second processing channel is non-homogenous with respect to the first processing channel, and wherein the second analog signal is provided by a second type of sensing element that is different than the first type of sensing element; and
   a checker circuit responsive to the first processed signal and the second processed signal and configured to detect a fault in the sensor integrated circuit and generate a fault signal indicative of the fault when the first processed signal and the second processed signal differ from each other by more than a predetermined amount, wherein the checker circuit comprises a first sample circuit configured to sample the first processed signal and generate a first sampled signal, a second sample circuit configured to process the second processed signal and generate a second sampled signal, and a window comparator responsive to the first sampled signal and the second sampled signal and configured to generate the fault signal.

2. The sensor integrated circuit of claim 1, wherein the first type of sensing element and the second, different type of sensing element comprise one or a combination of more than one of optical sensing elements, pressure sensing elements, or magnetic field sensing elements.

3. The sensor integrated circuit of claim 1 wherein the first processing channel has a first accuracy and the second processing channel has a second accuracy different than the first accuracy.

4. The sensor integrated circuit of claim 1 wherein the first processing channel comprises at least one different circuit element than the second processing channel.

5. The sensor integrated circuit of claim 1 wherein the first processing channel comprises a circuit to generate the first processed signal according to a first sensing methodology and the second processed signal comprises a second circuit to generate the second processed signal according to a second sensing methodology that is different than the first sensing methodology.

6. The sensor integrated circuit of claim 1 further comprising a single semiconductor die configured to support the first processing channel, the second processing channel, and the checker circuit.

7. A sensor integrated circuit comprising:
   a first processing channel responsive to a first analog signal to generate with a first accuracy a first processed signal; wherein the first analog signal is provided by a first type of sensing element;
   a second processing channel responsive to a second analog signal to generate with a second accuracy a second processed signal, wherein the second accuracy is different than the first accuracy, and wherein the second analog signal is provided by a second type of sensing element that is different than the first type of sensing element; and
   a checker circuit responsive to the first processed signal and the second processed signal and configured to detect a fault in the sensor integrated circuit and generate a fault signal indicative of the fault when the first processed signal and the second processed signal differ from each other by more than a predetermined amount, wherein the checker circuit comprises a first sample circuit configured to sample the first processed signal and generate a first sampled signal, a second sample circuit configured to process the second processed signal and generate a second sampled signal, and a window comparator responsive to the first sampled signal and the second sampled signal and configured to generate the fault signal.

8. The sensor integrated circuit of claim 7, wherein the first type of sensing element and the second, different type of sensing element comprise one or a combination of more than one of optical sensing elements, pressure sensing elements, or magnetic field sensing elements.

9. The sensor integrated circuit of claim 8 further comprising:
   at least one first sensing element configured to sense light, a pressure, or a magnetic field and generate the first analog signal for coupling to the first processing channel; and
   at least one second sensing element configured to sense the light, the pressure, or the magnetic field and generate the second analog signal for coupling to the second processing channel.

10. The sensor integrated circuit of claim 8 wherein the first type of sensing element and the second, different type of sensing elements comprise one or more of: a Hall effect element or a magnetoresistance element.

11. The sensor integrated circuit of claim 10 wherein the first type of sensing element and the second, different type of sensing element comprise one or more of a planar Hall effect element, a vertical Hall effect element, a circular vertical Hall effect element, Indium Antimonide (InSb), a giant magnetoresistance (GMR) element, an anisotropic magnetoresistance (AMR) element, a tunneling magnetoresistance (TMR) element or a magnetic tunnel junction (MTJ) element.

12. The sensor integrated circuit of claim 7 further comprising a sensing element configured to sense a parameter and generate both the first analog signal for coupling to the first processing circuit and the second analog signal for coupling to the second processing circuit.

13. The sensor integrated circuit of claim 7 wherein the first processing channel comprises a first analog-to-digital converter configured convert the first analog signal into a first digital signal and the second processing channel comprises a second analog-to-digital converter configured to convert the second analog signal into a second digital signal.

14. The sensor integrated circuit of claim 13 wherein the first analog-to-digital converter has a first conversion accuracy and the second analog-to-digital converter has a second conversion accuracy different than the first conversion accuracy.

15. The sensor integrated circuit of claim 14 wherein the first analog-to-digital converter and the second analog-to-digital converter are different ones of a sigma-delta analog-to-digital converter, a dual slope analog-to-digital converter, and a successive approximation analog-to-digital converter.

16. The sensor integrated circuit of claim 7 further comprising:
   a pulse width modulation (PWM) generator responsive to the first processed signal to generate a PWM output signal having a duty cycle related to a level of the processed signal;
   a multiplexer having a first input coupled to receive the PWM output signal, a second input coupled to receive a reference signal, and an output at which a selected one of the PWM output signal and the reference signal is provided; and a pull-down resistor coupled to the output of the multiplexer, wherein the multiplexer is controlled by the fault signal.

17. The sensor integrated circuit of claim 7 wherein the predetermined amount comprises a predetermined percentage.

18. The sensor integrated circuit of claim 7 further comprising a time delay synchronizer providing a clock signal to the first sample circuit and to the second sample circuit and to the window comparator.

19. The sensor integrated circuit of claim 7 further comprising a delay element coupled to an input of the first sample circuit and configured to delay the first processed signal for coupling to the first sample circuit.

20. The sensor integrated circuit of claim 7 wherein the checker circuit comprises a first checker circuit and wherein the sensor integrated circuit further comprises a second checker circuit responsive to the first processed signal and the second processed signal and configured to detect a fault in the sensor integrated circuit when the first processed signal and the second processed signal differ from each other by more than the predetermined amount.

21. The sensor integrated circuit of claim 7 further comprising a single semiconductor die configured to support the first processing channel, the second processing channel, and the checker circuit.

22. The sensor integrated circuit of claim 7 further comprising a first semiconductor die configured to support the first processing channel and a second semiconductor die configured to support the second processing channel and the checker circuit.

23. The sensor integrated circuit of claim 7, wherein the sensor integrated circuit comprises a linear optical sensor, a speed sensor, or a motor controller.

24. The sensor integrated circuit of claim 7 wherein the checker circuit comprises a first checker circuit and wherein the sensor integrated circuit further comprises:
a first semiconductor die configured to support the first processing channel, the second processing channel, and the checker circuit;
a third processing channel responsive to a third analog signal to generate with the first accuracy a third processed signal;
a fourth processing channel responsive to a fourth analog signal to generate with the second accuracy a fourth processed signal;
a second checker circuit responsive to the third processed signal and the fourth processed signal and configured to detect a fault in the sensor integrated circuit when the third processed signal and the fourth processed signal differ from each other by more than the predetermined amount; and
a second semiconductor die configured to support the third processing channel, the fourth processing channel, and the second checker circuit.

25. A sensor integrated circuit comprising:
a first processing channel responsive to a first analog signal to generate with a first accuracy a first processed signal;
a second processing channel responsive to a second analog signal to generate with a second accuracy a second processed signal, wherein the second accuracy is different than the first accuracy;
a checker circuit responsive to the first processed signal and the second processed signal and configured to detect a fault in the sensor integrated circuit and generate a fault signal indicative of the fault when the first processed signal and the second processed signal differ from each other by more than a predetermined amount, wherein the checker circuit comprises a first sample circuit configured to sample the first processed signal and generate a first sampled signal, a second sample circuit configured to process the second processed signal and generate a second sampled signal, and a window comparator responsive to the first sampled signal and the second sampled signal and configured to generate the fault signal;
at least one first sensing element configured to sense light, a pressure, or a magnetic field, and generate the first analog signal for coupling to the first processing channel; and
at least one second sensing element configured to sense the light, the pressure, or the magnetic field and generate the second analog signal for coupling to the second processing channel.

26. The sensor integrated circuit of claim 25, wherein the at least one first sensing element and the second at least one second sensing element comprise one or a combination of more than one of optical sensing elements, pressure sensing elements, or magnetic field sensing elements.

27. The sensor integrated circuit of claim 26 wherein the at least one first sensing element and the at least one second sensing element comprise different types of sensing elements.

28. The sensor integrated circuit of claim 27 wherein the different types of sensing elements comprise one or more of: a Hall effect element or a magnetoresistance element.

29. The sensor integrated circuit of claim 28 wherein the different types of sensing elements comprise one or more of a planar Hall effect element, a vertical Hall effect element, a circular vertical Hall effect element, Indium Antimonide (InSb), a giant magnetoresistance (GMR) element, an anisotropic magnetoresistance (AMR) element, a tunneling magnetoresistance (TMR) element or a magnetic tunnel junction (MTJ) element.

* * * * *

UNITED STATES PATENT AND TRADEMARK OFFICE
CERTIFICATE OF CORRECTION

| | |
|---|---|
| PATENT NO. | : 10,580,289 B2 |
| APPLICATION NO. | : 16/444347 |
| DATED | : March 3, 2020 |
| INVENTOR(S) | : David Jamie Haas et al. |

It is certified that error appears in the above-identified patent and that said Letters Patent is hereby corrected as shown below:

In the Specification

Column 1, Line 63 delete "t the first" and replace with --the first--.

Column 2, Line 3 delete "and the send" and replace with --and the second--.

Column 7, Line 47 delete "conveys" and replace with --convey--.

Column 9, Line 5 delete "desirable in" and replace with --desirable to--.

Signed and Sealed this
Twenty-second Day of September, 2020

Andrei Iancu
*Director of the United States Patent and Trademark Office*